United States Patent [19]

Könemann et al.

[11] 4,377,757
[45] Mar. 22, 1983

[54] LOGIC MODULE FOR INTEGRATED DIGITAL CIRCUITS

[75] Inventors: Bernd Könemann; Joachim Mucha; Günther Zwiehoff, all of Aachen, Fed. Rep. of Germany

[73] Assignee: Siemens Aktiengesellschaft, Berlin & Munich, Fed. Rep. of Germany

[21] Appl. No.: 120,070

[22] Filed: Feb. 11, 1980

[51] Int. Cl.³ .................. H03K 3/335; H03K 21/00
[52] U.S. Cl. ..................... 307/303; 307/465; 324/73 R; 307/220 R
[58] Field of Search ............ 307/471, 472, 465, 303, 307/220 R; 328/159; 324/73 R, 73 PC

[56] References Cited

U.S. PATENT DOCUMENTS

| | | | |
|---|---|---|---|
| 3,007,115 | 10/1961 | Batley | 307/471 |
| 3,924,144 | 12/1975 | Hadamard | 324/73 R |
| 3,950,705 | 4/1976 | Fuerherm | 307/471 |
| 4,054,788 | 10/1977 | Maitland et al. | 307/472 |
| 4,139,818 | 2/1979 | Schneider | 324/73 PC |

OTHER PUBLICATIONS

M. J. Y. Williams et al., "Enhancing Testability of Large Scale Integrated Circuits Via Test Points and Additional Logic", IEEE Trans. Computers C-22, pp. 46–60, 1973.

R. A. Frohwerk, "Signature Analysis: A New Digital Field Service Method", Hewlett Packard Journal, pp. 2–8, May, 1977.

Primary Examiner—Stanley D. Miller
Assistant Examiner—B. P. Davis
Attorney, Agent, or Firm—Hill, Van Santen, Steadman, Chiara & Simpson

[57] ABSTRACT

A logic module is disclosed for construction in an integrated digital circuit for promoting testing of the integrated circuit. A latch module is provided for functioning as a latch, as a back-coupled shift register, and in one embodiment of the invention as a linear shift register. The latch module is formed of a plurality of basic cells each of which has a flip-flop with associated logic gates, one of which is an exclusive OR gate. The latch module also has an input, parallel data inputs and parallel data data outputs. For functioning in the back-coupling mode, an exclusive OR gate is connected between at least one of the flip-flops and the input to the latch module.

7 Claims, 8 Drawing Figures

$B_0 = B_1 = 1$

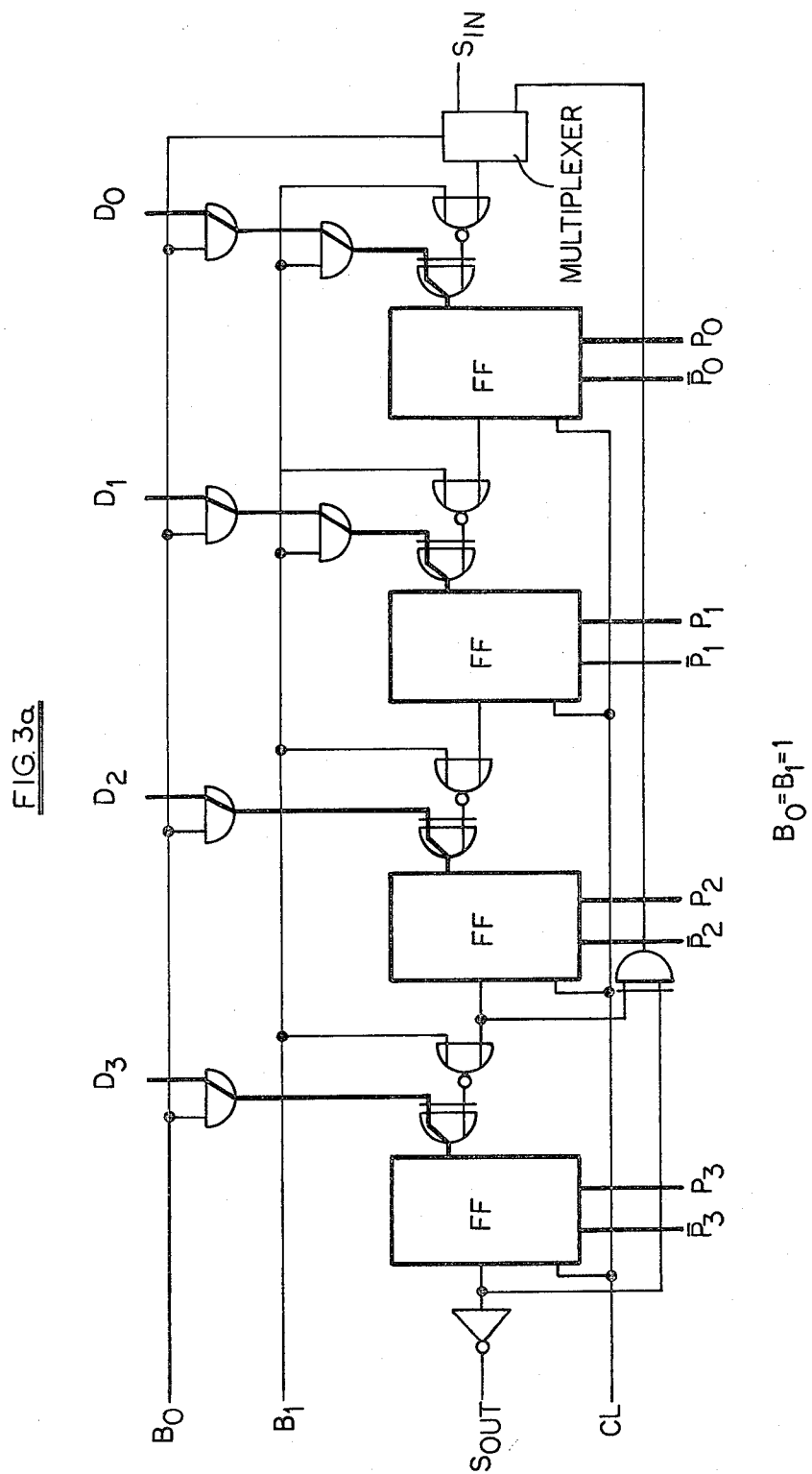

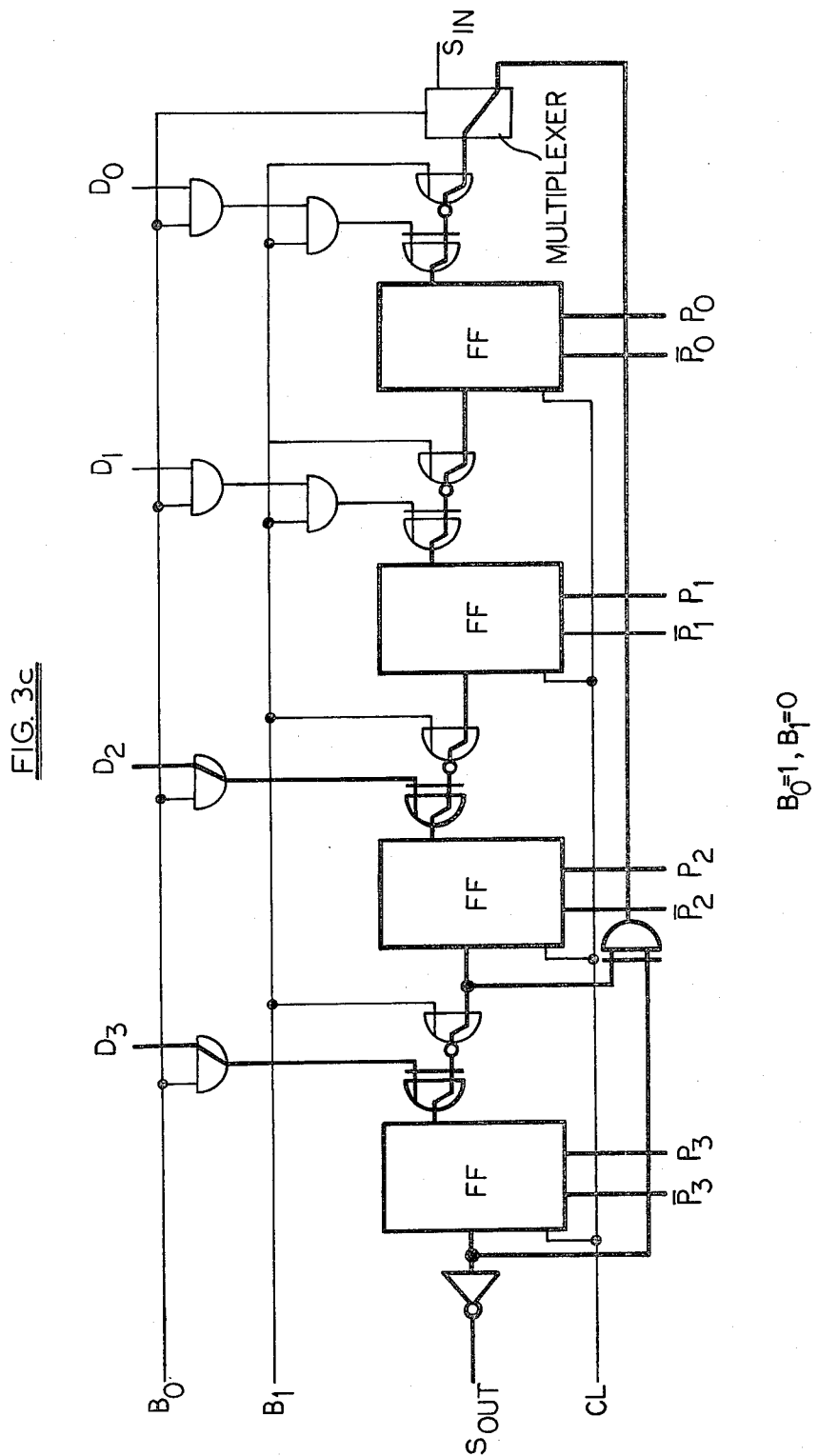

LOGIC MODULE FOR INTEGRATED DIGITAL CIRCUITS

BACKGROUND OF THE INVENTION

The invention relates to a logic module for integrated digital circuits. By incorporating suitable circuit portions into the integrated circuit itself, the checking of its logic function is facilitated and, given very complicated circuits makes logic function checks possible where such checks were not previously considered possible.

In order to guarantee their functionability, integrated circuits are repeatedly subjected to inspections during their manufacture and use. For this purpose, the integrated circuits are operated to output a sequence of test data as a result of a suitable input sequence of test data. By means of comparison with known test data, it is determined whether the circuit tested is error-free or not.

In previous testing methods for integrated circuits, the test patterns were supplied to the item being tested by an automatic testing unit via the input pins of the test item and the test data were interrogated by the testing unit via the output pins. Both the generation of the test patterns as well as the evaluation of the test data in this case occur outside of the item being tested. Proposals hitherto known for the design of integrated digital circuits amenable to testing predominantly aim at a passive support of the standard testing methods. The possibility of also being able to directly address for testing purposes such circuit parts which are not directly accessible from the outside during normal operation is offered by integrated circuits whose internal registers can be connected together for testing purposes into a shift register chain (scan path) via which, proceeding from an additional input pin, serial data can be conducted from there to internal circuit points which otherwise have difficult access or, respectively, from there to an additional output pin.

In known testing operations, the test patterns are generated outside of the item being tested and are supplied to its via suitable adapters and contacts. A so-called "pin electronics" performs the drive of the contacts. The continuously increasing work speed and increasing length of the test patterns required for a sufficient test precision going along with increasing circuit complexity require that the pin electronics transmit and process very great data volumes within the shortest time. These demands can be met only by very complex and expensive structures upon incorporation of sufficiently large and quick control computers. The high investment in operating costs deriving therefrom for the automatic testing units force the employment of very effective testing patterns whose manual or automatic erection is in turn possible only by means of the use of very complicated simulation programs on large computers. In all, testing costs today already account for a significant portion of the total manufacturing costs of integrated digital circuits. This cost component will increase further with increasing circuit complexity. For many users, the expense required for careful testing is today already too high. In integrated circuits, one can employ a scan path for monitoring internal data flow but must then accept the disadvantage that the data can only be moved serially in the shift register chain, which leads to significant losses of time.

Further information concerning integrated circuit testing can be found in the following references, incorporated herein by reference:
(1) M. J. Y. Williams and J. B. Angell, "Enhancing Testability of Large Scale Integrated Circuits Via Test Points and Additional Logic", IEEE Trans. Computers C-22, pp. 46-60, 1973; and
(2) R. A. Frohwerk, "Signature Analysis: A New Digital Field Service Method", Hewlett Packard Journal, pp. 2-8, May 1977.

SUMMARY OF THE INVENTION

It is an object of this invention to alleviate the above described situation. The invention achieves the object by creating a logic module for integrated digital circuits amenable to testing, with the assistance of which, among other things, hardware-wise test patterns are generated within the circuit itself to be tested and internally arising test data can be monitored in parallel, so that the external expense required for the implementation of testing is significantly reduced.

The advantages achieved by means of the invention are essentially that parts of the large data quantities to be manipulated with very high velocity upon testing integrated digital circuits are generated and can be evaluated within the item being tested itself, so that only a few control signals required for controlling the test sequence need be transmitted during this operation to the item being tested. By means of the incorporation of the logic modules for test pattern generation and for parallel test data monitoring, it becomes possible to individually test circuit portions or modules of complex circuits, said individual circuit portions being capable of simple testing, so that the high costs standard up to now for erecting the test patterns are partially eliminated without having to accept the loss of speed in the implementation of the test occurring upon employment of a scan path. To at least the same degree as the testing of individual integrated circuits, the testing of logic modules in the environment of embedded integrated circuits is facilitated. In particular, maintenance of combined systems is promoted in that a test logic is available within the circuits. Further, the co-integrated test logic renders possible the functional test of critical circuit parts during use in control and regulation systems of which a high reliability is demanded.

DESCRIPTION OF THE PREFERRED EMBODIMENTS

Figure 1A:
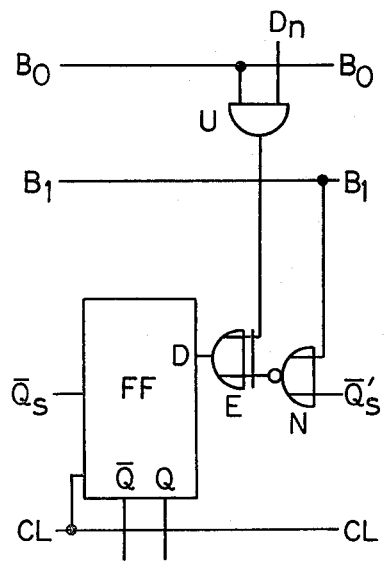
FIGS. 1a and 1b illustrate logic circuit diagrams of the two types of basic cells employed in the logic module of this invention.
Figure 1B:
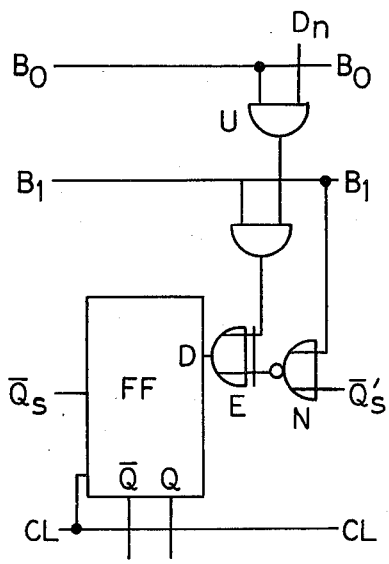
Figure 2:
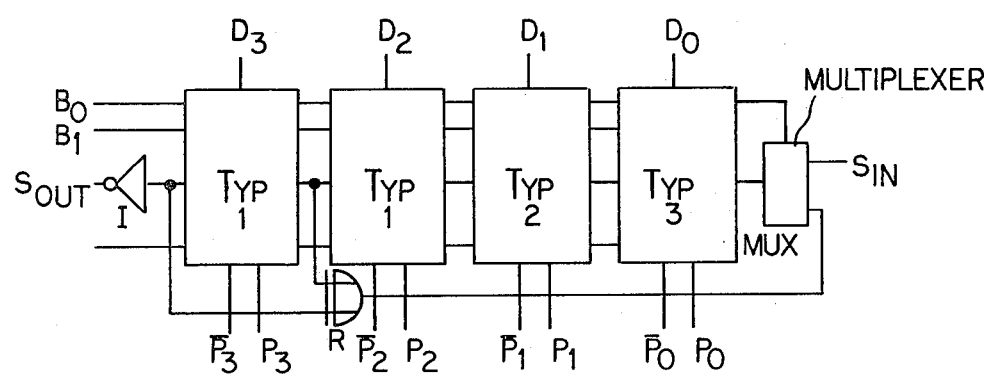
FIG. 2 illustrates by a schematic example, how the basic cells can be combined to form the inventive logic module whose modes of operation are illustrated in FIGS. 3a, 3b and 3c by means of emphasizing the respectively connected through data paths.

The logic module, essentially consisting of interconnected basic cells of two different types and for integrated digital circuits amenable to testing, is illustrated in the Figures. The basic cell of type 1 illustrated in FIG. 1a consists of a flip-flop FF employable as a shift register cell, for example, a master-slave flip-flop, the output of an exclusive OR gate E being connected to its input D. One input of E is connected to the output of an AND gate U in which the data $D_n$ are linked with the control signal $B_0$. The other input of E is connected to the output of a NOR gate N in which the data $\overline{Q_s}'$ are linked with the second control signal $B_1$. The clock pulse supply of FF ensues via the input referenced with CL. The mutually inverted outputs Q and $\overline{Q}$ are taken out of FF in such manner that the logic module becomes a latch (buffer) of the type desired for the respective use in the normal operation described below. For example, given employment of master-slave flip-flops, the two outputs of the master flip-flop are employed for Q and $\overline{Q}$. The output $\overline{Q_s}$ is required in the shift register operation; accordingly, the inverse output of the slave flip-flop, for example, can be employed for $\overline{Q_s}$. The basic cell of type 2 illustrated in FIG. 1b differs from that of type 1 only in that a further AND gate W is connected between U and E, in which AND gate W the output of U is linked with $B_1$. An inventive logic module is composed of m basic cells of type 1 and M-m basic cells of type 2, whereby $m < M$. On the basis of an example with M=4 and m=2, FIG. 2 illustrates the interconnection of the basic cells to form an inventive logic module. Depending on the value of the control signal $B_0$, the multiplexer MUX connects either the input $S_{IN}$ or the output of the exclusive OR gate R through. The output signal $S_{OUT}$ is formed by inverter I from the output $\overline{Q_s}$ of the basic cell positioned farthest to the left in FIG. 2.

Figure 3B:
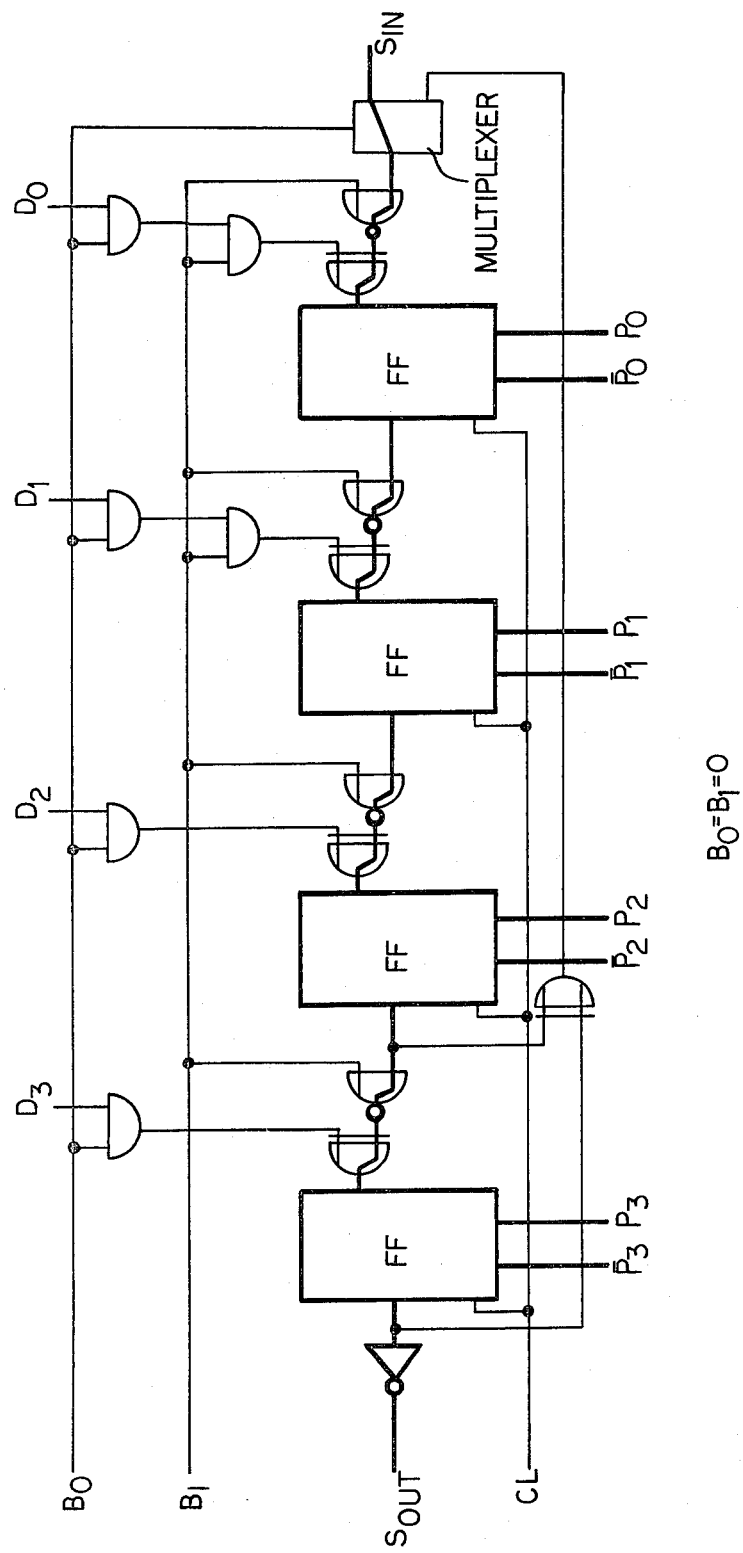
Figure 4:
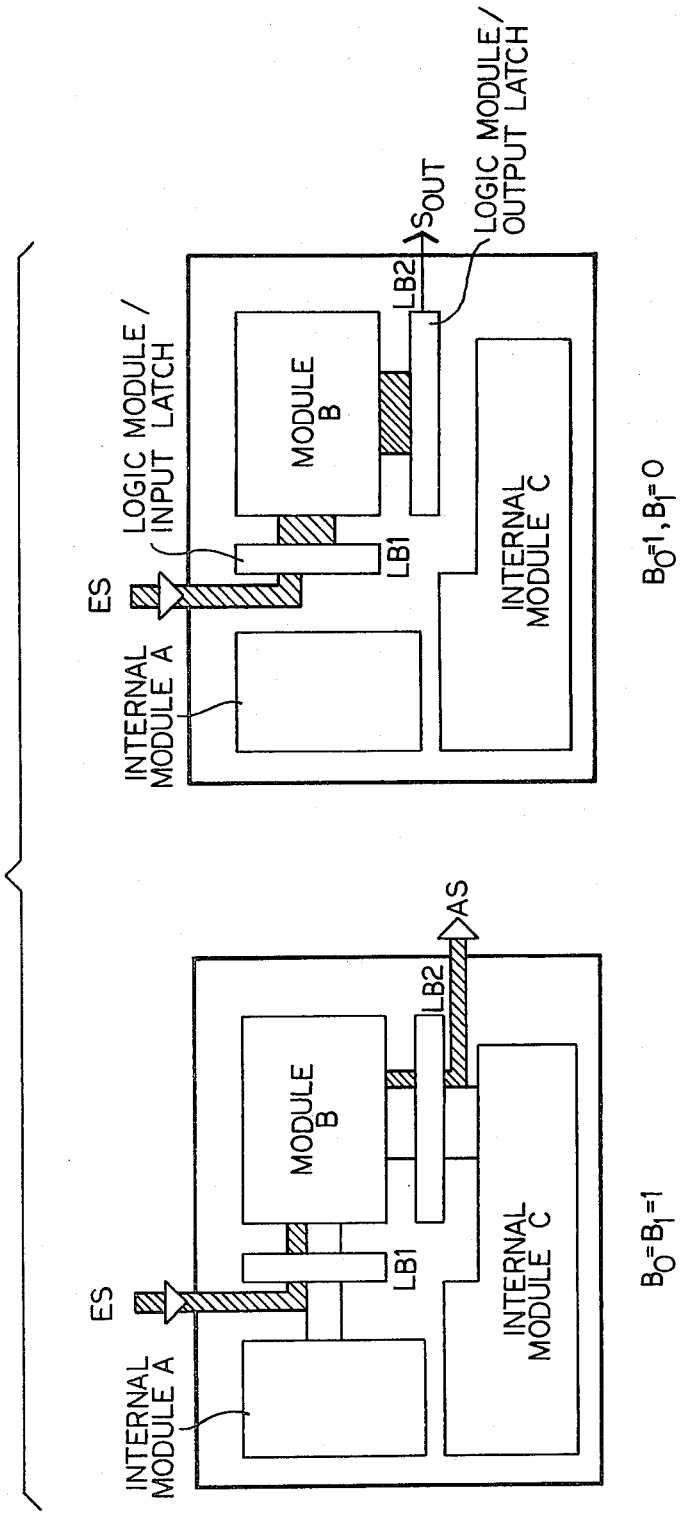
FIG. 4 is a block diagram illustrating an example for the incorporation and the employment of the inventive logic modules in integrated circuits.

According to the invention, the logic module described can assume various tasks for the active and passive support of the functional testing of integrated digital circuits. The operating mode of the logic module is selected via the two control inputs $B_0$ and $B_1$. In order to illustrate the various operating modes possible, it is shown in FIGS. 3a, 3b and 3c by means of thicker lines which data paths are respectively connected through the gates. Accordingly, the example illustrated in FIG. 2 is employed. In normal operation determined by means of $B_0 = B_1 = 1$, the logic module functions, as can be derived from FIG. 3a, as a latch: the data inputs $D_0$ through $D_3$ are directly connected through to the inputs of the register cells FF. If one selects $B_0 = B_1 = 0$, then the logic module can be employed as a part of a scan path, as can be seen from FIG. 3b. In this operational mode, the logic module functions as a linear shift register into which serial data are read via the input $S_{IN}$ and from which data can be read out either serially via the output or in parallel via outputs $P_0$ through $P_3$ or, respectively, inverted via $\overline{P_0}$ through $\overline{P_3}$. In the operational mode determined by means of $B_0=1$ and $B_1=0$, the logic module generates a data sequence controllable via the data inputs $D_2$ and $D_3$: the register cells are interconnected via the exclusive OR gate R to form a back-coupled shift register into which data can be rolled in via the data inputs leading to the basic cells of type 1. In this operating mode, the logic module can be employed for generating test patterns or can be employed as a signature register (2) with parallel data inputs for monitoring test data. In the fourth possible operating mode ($B_0=0$, $B_1=1$), a logical zero is respectively present at the inputs of the register cells, so that this operating mode can be employed for resetting the register contents. As illustrated in FIG. 4, inventive logic modules (LB1, LB2) incorporated in integrated circuits increase the controllability and observability of internal circuit parts: in normal operation ($B_0=B_1=1$), LB1 functions as an input latch LB2 functions as an output latch B. In this operating mode, module B is only partially directly controllable from the outside via the input pins ES and observable via the output pins AS (shaded data paths). The remaining input or, respectively, output data of module B stem from the internal module A or, respectively, proceed into the internal module C. In test operation, LB1 and LB2 can be operated as back-coupled shift registers ($B_0=1$, $B_1=0$). LB1 is designed in such manner that the data inputs leading to basic cells of type 1 and available in parallel in this operating mode are controllable via ES from the outside, whereas the data inputs stemming from module A lead to basic cells of type 2 and are thus switched off. In contrast thereto, LB2 should be able, in operation as a back-coupled shift register, to respectively accept in parallel all output data simultaneously generated by module B. At the end of the testing operation, then, a data word or signature characterizing the entire test sequence is then in register LB2; this data word can then be serially read out via $S_{OUT}$, for example, in scan path operation ($B_0=0$, $B_1=0$). As illustrated by means of shading, the signature contains information concerning all output data generated by module B during the test operation. In all, the module B in normal operation embedded between modules A and C, can thus be controlled and observed from the outside during test operation. The time-consuming serial shift register operation need be employed only once for the read-out of a word, the signature, in the example illustrated.

Figure 5:
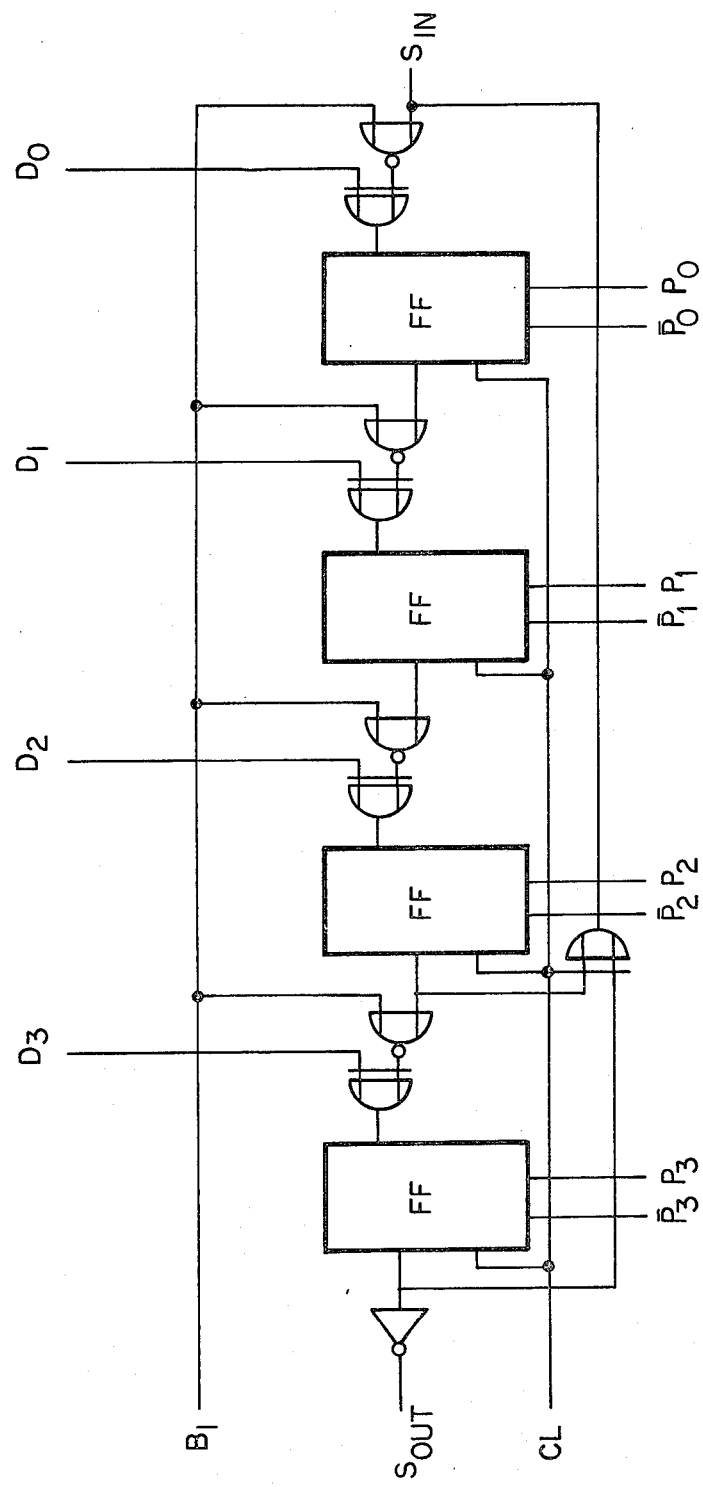
FIG. 5 is a block diagram illustrating a simplification of the circuit of FIGS. 3a,b,c in another embodiment of the invention.

As shown in FIG. 5, the basic cells are simplified by means of the omission of the control inputs $B_0$ and of the gates. In the connection of the basic cells among one another, the output of the gate R is directly connected to the input $\overline{Q_s}'$ of the basic cell belonging to the data input $D_0$ by means of omitting the multiplexer MUX, so that the logic module cannot be operated as a linear shift register.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A logic module for construction in an integrated digital circuit for promoting testing of the integrated circuit, comprising:

a plurality of interconnected basic cells, each of said basic cells being formed of a flip-flop connecting with a logic circuit comprised of a plurality of logic gates associated with each flip-flop, one of the logic gates of the logic circuit being an exclusive OR gate whose output connects to a data input of the corresponding flip-flop, the basic cells being interconnected in a chain through the logic gate circuits to form a logic module having a signal input, parallel data inputs connecting with the flip-flops through the logic gate circuits, at least one signal output derived from the flip-flops, first and second control signal lines connecting to the data inputs of the flip-flops through the associated logic gate circuits, a multiplexer connecting between at least one of the flip-flops and said signal input, and an exclusive OR gate also connecting to the multiplexer and an output of at least one of the other flip-flops so as to permit a back-coupling mode of operation; and said logic module forming a test logic module means which, depending upon signals applied to first and second control signal lines, operates in a normal mode as a latch with the parallel data inputs connected through by the logic gate circuits to the data inputs of flip-flops, in a linear shift register mode operates such that serial data are read in via the module signal input and from which data can be read out either serially via the signal output or in parallel via individual basic cell outputs, or in a back-coupled shift register mode operates such that data is rolled in from other basic cells via the multiplexer.

2. A testing system for an integrated signal digital circuit, comprising:
an integrated digital circuit having at least two modules, one of which is to be tested;
a logic module internally constructed in the same integrated digital circuit and connected between the two modules;
said logic module having a plurality of series interconnected flip-flop cells with logic gates connected to their inputs, a signal input, a signal output, parallel data inputs, first and second control signal lines, individual parallel data outputs for latch operation from each flip-flop cell, and multiplexer circuit means for back-coupled operation connected at the signal input; and
said logic module having circuit means such that depending upon signals applied to the first and second control signal lines, the logic module operates in a normal mode as a latch with the parallel data inputs connected through by the logic gates to the data inputs of the flip-flops, in a linear shift register mode operates such that serial data may be read in via the module signal input and from which data can be read out either serially via the signal output or in parallel via the individual cell outputs, or operates in a back-coupled shift register mode wherein data is rolled in from other flip-flops through the multiplexer.

3. An integrated circuit test system, comprising:
an integrated digital circuit comprising a module to be tested and a testing logic module means connected thereto as a latch;
said testing logic module means being formed of a plurality of flip-flops each having a data input, individual parallel data outputs for latch operation, a signal output, and a clock input;
first and second control signal lines;
logic gate means associated with each flip-flop data input for connecting the flip-flops in a chain by their data inputs and signal outputs, for connecting the control signal lines to the flip-flop data inputs, and for creating parallel inputs for the testing logic module means such that signals thereon can be combined with signals on the control signal line;
a signal input and signal output for the logic module means;
a multiplexer connected between the signal input and the logic gate means of one of the flip-flops;
a data feedback means connected between a signal output of one of the flip-flops and an input of the multiplexer for back-coupled shift register operation and depending upon signals applied to the first and second control signal lines, the logic module means operating in a normal mode as a latch with the parallel data inputs connected through by the logic gates to the data inputs of the flip-flops, in a linear shift register mode operating such that serial data may be read in via the module signal input and from which data can be read out either serially via the signal output or in parallel via the individual cell outputs, or operating in a back-coupled shift register mode wherein data is rolled in from other flip-flops through the multiplexer.

4. An integrated circuit test system, comprising:
an integrated digital circuit comprising a module to be tested and a testing logic module connected thereto as a latch;
said testing logic module being formed of a plurality of flip-flops each having a data input, individual outputs, a signal output, and a clock input;
first and second control signal lines;
logic gate means associated with each flip-flop data input for connecting the flip-flops in a chain by their data inputs and signal outputs, for connecting the control signal lines to the flip-flop data inputs, and for creating parallel inputs for the testing logic module such that signals thereon can be combined with signals on the control signal line;
a signal input and a signal output for the logic module;
a multiplexer connected between the signal input and the logic gate means of one of the flip-flops;
a data feedback means connected between a signal output of one of the flip-flops and an input of the multiplexer for back-coupled shift register operation; and
the logic gate means comprising an AND gate connected to the first control signal line, a NAND gate connected to the second control signal line, and an exclusive OR gate whose inputs are respectively connected to outputs of the AND and NAND gates and having its output connected to the data input of the respective flip-flop.

5. An integrated circuit test system, comprising:
an integrated digital circuit comprising a module to be tested and a testing logic module connected thereto as a latch;
said testing logic module being formed of a plurality of flip-flops each having a data input, individual outputs, a signal output, and a clock input;
first and second control signal lines;
logic gate means associated with each flip-flop data input for connecting the flip-flops in a chain by their data inputs and signal outputs, for connecting the control signal lines to the flip-flop inputs, and for creating parallel inputs for the testing logic module such that signals thereon can be combined with signals on the control signal line;
a signal input and signal output for the logic module;
a multiplexer connected between the signal input and the logic gate means of one of the flip-flops;
a data feedback means connected between a signal output of one of the flip-flops and an input of the multiplexer for back-coupled shift register operation; and
the feedback means comprising an exclusive OR gate whose inputs are connected to two signal outputs of two of the flip-flops and whose output connects to an input of the multiplexer along with the signal input of the test module.

6. An integrated circuit test system, comprising:

an integrated digital circuit comprising a module to be tested and a testing logic module connected thereto as a latch;

said testing logic module being formed of a plurality of flip-flops each having a data input, individual outputs, a signal output, and a clock input;

first and second control signal lines;

logic gate means associated with each flip-flop data input for connecting the flip-flops in a chain by their data inputs and signal outputs, for connecting the control signal lines to the flip-flop data inputs, and for creating parallel inputs for the testing logic module such that signals thereon can be combined with signals on the control signal line;

a signal input and signal output for the logic module;

a multiplexer connected between the signal input and the logic gate means of one of the flip-flops;

a data feedback means connected between a signal output of one of the flip-flops and an input of the multiplexer for back-coupled shift register operation; and the parallel data input comprising one of the inputs of an AND gate, whose other input connects to one of the control signal lines, and whose output connected to an input of an exclusive OR gate whose output connected to the data input of the respective flip-flop.

7. An integrated circuit test system, comprising:

an integrated digital circuit comprising a module to be tested and a testing logic module connected thereto as a latch;

said testing logic module being formed of a plurality of flip-flops each having a data input, individual outputs, a signal output, and a clock input;

first and second control signal lines;

logic gate means associated with each flip-flop data input for connecting the flip-flops in a chain by their data inputs and signal outputs, for connecting the control signal lines to the flip-flop data inputs, and for creating parallel inputs for the testing logic module such that signals thereon can be combined with signals on the control signal line;

a signal input and signal output for the logic module;

a multiplexer connected between the signal input and the logic gate means of one of the flip-flops;

a data feedback means connected between a signal output of one of the flip-flops and an input of the multiplexer for back-coupled shift register operation; and within the integrated digital circuit, two of said test logic modules being provided, one being connected as an input latch during normal operation at an input of the module and the other being connected as an output latch at an output of the module to be tested.

* * * * *